United States Patent [19]

Legrady

[11] Patent Number: 4,688,866
[45] Date of Patent: Aug. 25, 1987

[54] QUICK DISCONNECT CONTACT FOR PRINTED CIRCUIT BOARDS

[75] Inventor: Janos Legrady, Putnam Valley, N.Y.

[73] Assignee: Zierick Manufacturing Corporation, Mount Kisco, N.Y.

[21] Appl. No.: 845,994

[22] Filed: Mar. 31, 1986

[51] Int. Cl.$^4$ ............................................. H01R 13/41
[52] U.S. Cl. ...................................................... 439/78
[58] Field of Search ............. 339/17 C, 220 R, 220 L, 339/220 T, 125 R, 126 R

[56] References Cited

U.S. PATENT DOCUMENTS 3,178,672  4/1965  Batcheller ...................... 339/220 R
4,273,399  6/1981  Myers et al. ..................... 339/17 C
4,436,358  3/1984  Coldren et al. ................. 339/220 R

FOREIGN PATENT DOCUMENTS 0140611  3/1980  German Democratic Rep. ... 339/17 C

OTHER PUBLICATIONS

Catalog 29 of Zierick Manufacturing Corp., p. 35.

Primary Examiner—Gil Weidenfeld
Assistant Examiner—Gary F. Paumen
Attorney, Agent, or Firm—Lilling & Greenspan

[57] ABSTRACT

A method and quick disconnect contact for mounting on a pre-drilled circuit board is disclosed. The generally flat contact is provided with two stabilizing portions between the mounting legs. The stabilizing portions form pivot or pressure points spaced from or offset from associated major surfaces of the contact to minimize deformation and likelihood of breakage of the mounting legs upon application of external forces.

13 Claims, 7 Drawing Figures

QUICK DISCONNECT CONTACT FOR PRINTED CIRCUIT BOARDS

BACKGROUND OF THE INVENTION

This invention generally relates to electrical contacts, and particularly to quick disconnect tab-type terminals for printed circuit boards.

Many designs have been proposed for quick disconnect terminals for printed circuit (P.C.) boards. Such terminals are typically inserted into pre-drilled holes in printed circuit boards, molded ceramic and plastic or metal housings. In some instances the designes have resulted in a substantial cost to the manufacturers of the terminals and in some cases the preparations of the printed circuit boards to receive the terminal have likewise been expensive and cumbersome.

One common type of quick disconnect tab P.C. boards, such as a male quick disconnect tab, includes two generally parallel mounting legs which are intended to be received within two spaced holes which are pre-drilled in the P.C. board. Such tabs are described on page 35 of Catalog 29, published by the assignee of the subject application. Although male tabs or contacts are normally made of a relatively thick stock metal, typically 0.032", the mounting legs have a generally small cross-sectional area and are the weakest part of the tab and the most likely to bend in response to forces applied to the planar or flat surfaces of the tab.

In U.S. Pat. No. 4,436,358, a terminal tab for mounting on a circuit board is described which includes a central mounting leg intended to be passed through a pre-drilled hole in the board and a pair of stabilizing arms on each side of the mounting leg which extend in opposite directions and which are normal to the plane of the tab. These stabilizing arms are produced by bending lateral or side extensions on the blank forming the terminal, in opposite directions to create the stabilizing surfaces on each arm which bear against the surface of the circuit board on which the tab is mounted. However, the aforementioned construction requires additional metal on each side of the tab to create the stabilizing arms as well as additional metal on the top of the tab for the carrier strip if the part is made in chain or strip form. Additionally, since the stabilizing arms project outwardly from the tab, the tab occupies additional surface area or space on the board, a commodity which is at a premium on densely packed boards.

Another known construction is disclosed in U.S. Pat. No. 3,178,672 for a double-ended connector for a terminal board. However, the connector is provided with two spaced pairs of outwardly projecting ears for receiving the P.C. board therebetween with one pair of ears on each side of the board for locking the connector in relation to the board. The ears are not intended nor do they provide any meaningful stability. As with the above-described prior art construction, the connector also requires additional material and space on the P.C. board. Since this construction, as well, requires lateral projections it is unnecesarily more costly to manufacture.

SUMMARY OF THE INVENTION

In order to overcome the disadvantages inherent in the prior art quick disconnect contact constructions, such a contact in accordance with the present invention, suitable for mounting on a pre-drilled P.C. board which is provided with two spaced holes for each contact, comprises a flat portion which defines oppositely facing major surfaces. The contact is also provided with two generally parallel mounting legs which are co-planar with said flat portion and which are spaced from each other and dimensioned to be receivable within the spaced holes. Said flat portion has a stabilizing edge between said mounting legs proximate to the printed circuit board when said mounting legs are fully inserted into the holes and the contact is secured to the printed circuit board. Said stabilizing edge forms two stabilizing portions each defining a pivot or pressure point spaced from or offset from an associated major surface. Accordingly, said stabilizing portions shift the pivot or pressure points from a plane within said flat portion to said stabilizing portions spaced from said flat portion thereby minimizing deformation and likelihood of breakage of said mounting legs upon application of external forces on the major surfaces of the contact.

BRIEF DESCRIPTION OF THE DRAWINGS

The manner in which the apparatus of the present invention is constructed and its mode of operation can be best understood from the following detailed description together with the accompanying figures in which.

DESCRIPTION OF THE PREFERRED EMBODIMENTS

Figure 1:
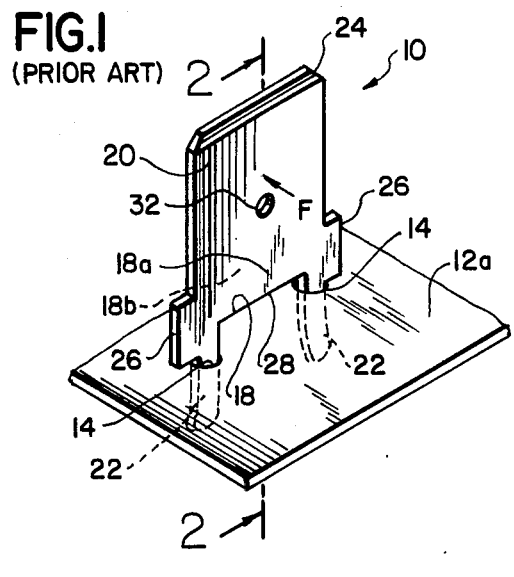
FIG. 1 is a perspective view of a male quick disconnect tab in accordance with a prior art construction mounted on a printed circuit board and illustrating a force F applied to one major surface of the tab.
Figure 2:
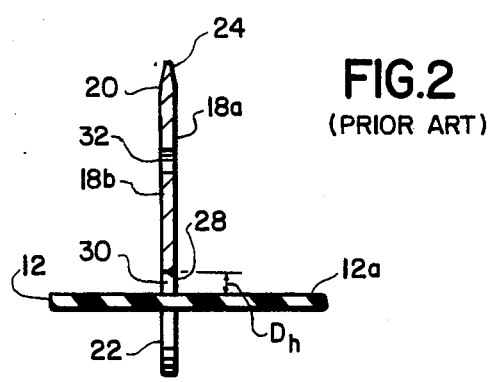
FIG. 2 is a cross-sectional view of the prior art tab shown in FIG. 1, taken along line 2—2.

Referring now specifically to the drawings, in which identical or similar arts are identified by the same reference numerals throughout, and first referring to FIGS. 1 and 2, a male quick disconnect contact in the form of a tab, lug, clip or terminal in accordance with a prior art construction is generally designated by the reference numeral 10.

The tab 10 is designed to be mounted on a printed circuit board 12 having an upper surface 12a on which the tab is mounted. The board 12 is provided with pre-drilled mounting holes 14.

The tab 10 includes a main body portion 16 which is shown formed of generally flat stock material. The main body portion 16 includes a lower flat portion 18 and an upper mating contact portion 20. The contact portion 20 in the embodiment is shown as a male contact portion or tab which is intended to engage and make electrical contact with an associated female contact portion (not shown). The lower flat portion 18, which is disposed proximate to the printed circuit board 12 and is provided on both male and female contacts, is not designed or intended to come into contact with a mating or associated connector or contact.

While the present invention will be described in conjunction with a male quick disconnect tab, it will be apparent from the description that follows that a contact can also be made in accordance with the invention which stabilizes a female quick disconnect terminal wherein the contact portion 20 comprises a female contact.

The dimensions of the printed circuit board quick disconnect contacts are generally manufactured in accordance with industry standards. For example, male quick disconnect tabs are offered in different sizes such as 0.110, 0.187, 0.205 and 0.250 inch standard widths. The thicknesses of the tabs range from approximately 0.20 to 0.032 inch.

The main body portion 16 defines a cutting plane parallel to and midway between oppositely facing major surfaces 18a and 18b. Two mounting legs 22 which, are co-planar with the flat portion 18, are spaced from each other and dimensioned to be receivable within the spaced holes 14.

Advantageously, as is customary in the trade, a bevel 24 is provided at the upper-most edge of the contact portion 20. Ears 26 are shown at each side of flat portion 18. These represent the severed inter-connecting strips between adjacent tabs when same are produced in strip or continuous form used with automatic insertion equipment. The ears 26, however, typically extend approximately 0.23–0.31 inch to each side of the flat portion 18 and, therefore, do not occupy appreciable space on the circuit board.

The flat body portion 18 includes a straight lower edge 28 between the mounting legs 22. Typically, in prior art quick disconnect tab constructions, the edge 28 is spaced above the upper surface 12a of the board when the tab is fully inserted so as to provide a space 30 between the lower flat portion 18 and the top of the board or upper surface 12a.

The bending moment generated by a side lateral force F (FIG. 1) on the prior art tab 10 is the greatest at the point where the main body portion 16 and the legs 22 of the tab meet. This is the weakest part of the tab because of the small cross-sectional areas of the legs 22. One-half of the cross-section of each leg, on the side of the cutting plane where the force F is applied, is under tension, while the other half of each leg cross-section, on the opposite side of the cutting plane, is under compression with a neutral axis at the central cutting plane. The neutrl axis, in a conventional quick disconnect tab, coincides with the above-mentioned cutting plane of the main body portion 20. Thus, the pivot or pressure points $P_o$ in the prior art constructions are located in the plane of the main body portion 16 and legs 22, as suggested in FIGS. 5–7, so that very little resistive torque is generated by the tab 10 and the application of a force F readily bends and deforms the legs 22. The item fails when the tensile stress reaches the ultimate strength of the legs 22 causing them to break. The cross-sectional areas of the legs 22 cannot be indefinitely increased as a solution to strenghten the legs since the thickness of the tabs and the hole sizes on the printed circuit board are standardized by the industry and such thicker tabs would represent higher manufacturing costs.

The prior art quick disconnect tab 10 also exhibits a hole 32 which is typically 0.070 inch in diameter which is intended to receive a dimple or spring biased portion on a mating or associated connector to prevent inadvertent separation of the two when in contact with each other.

Figure 3:
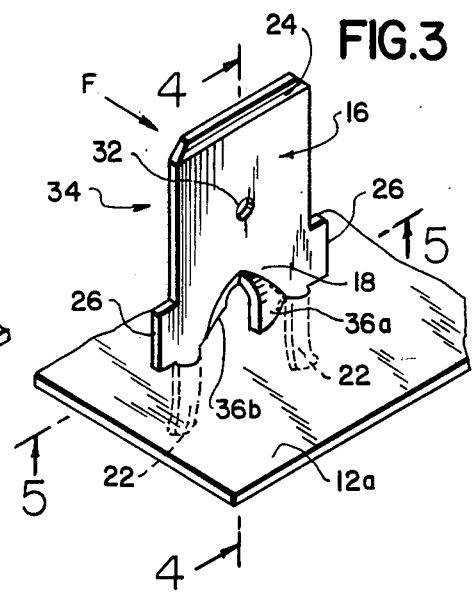
FIG. 3 is a view similar to FIG. 1, but showing a male quick disconnect tab or contact in accordance with the present invention in which the lower portion of the tab is lanced to produce the stabilizing or support portions.
Figure 4:
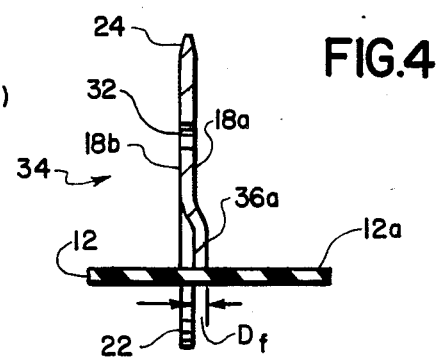
FIG. 4 is a cross-sectional view of the embodiment shown in FIG. 3, taken along line 4—4, showing the lower stabilizing edge to be in substantial abutment with the top or mounting surface of the printed circuit board.
Figure 5:
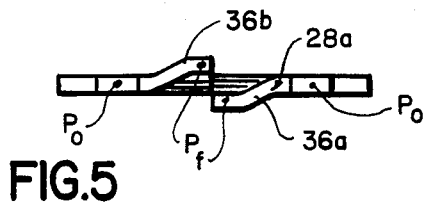
FIG. 5 is a cross-sectional view of the tab shown in FIG. 3, taken along line 5—5 to illustrate the stabilizing support portions and resulting displacement of the pivot or pressure points.

Referring to FIGS. 3, 4 and 5, an important feature of the present invention is the modification of the conventional straight lower edge 28 to provide a non-linear stabilizing edge between the mounting legs 22 proximate to the printed circuit board 12 when the mounting legs are fully inserted into the holes 14 and the tab is secured tot he printed circuit board.

Figure 6:
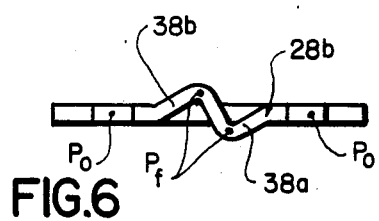
FIG. 6 is a view similar to FIG. 5, but showing an embodiment wherein the stabilizing or support portions are created by drawing.

Referring to FIGS. 4–6, a male quick disconnect tab in accordance with the present invention is generally designated by the reference numeral 34, wherein the lower flat portion 18 forms two stabilizing portions 36a and 36b each extending in opposite directions in relation to the main body portion 16 and defining pivot or pressure points $P_f$ offset from the cutting plane defined by the main body portion 16 and each spaced from an associated major surface 18a, 18b. In this way, the stabilizing edge shifts the original pivot or pressure points $P_o$ at the tab cutting plane to the final pivot or pressure points $P_f$ within the extreme outer points of the stabilizing or support portions 36a, 36b. The portions 36a, 36b rigidify and stabilize the tab 34 in relation to the board 12 and create resistive torques which minimize deformation and likelihood of breakage of the mounting legs 22 upon application of external forces F on the major surfaces of the tab 34.

In FIG. 4, the stabilizing or support portion 36a is shown to be in substantial abutment against the upper surface 12a of the board 12. Such construction optimizes the stability of the tab. However, in some instances, it may be desirable to provide a small space 30 below the stabilizing edge 28, as suggested in FIG. 2, to enhance air circulation for increased cooling or to remove dust by forced air flow. The space 30 must, however, be maintained at the minimum amount possible to avoid excessive bending. Bending of the tab 34 to angles of 10°–15° from the vertical may be acceptable without excessive stress or damage on the legs 14. Such deflections can be achieved when the stabilizing or lower edge 28 is spaced approximately 0.025" above the upper surface 12a. The amount of possible deflection is also a function of the hardness of the upper surface 12a of the board. Greater deflections may be possible with softer surfaces for the same spacing 30 since the board surface deteriorates under the forces applied by the stablizing portions. Thus, while some deflection may be possible with the arrangement shown in FIG. 4 ($D_h-0$) when the P.C. board has a soft surface such as a paper-phenolic material, a suitable spacing 30 ($D_h>0$) should be provided with harder materials, such as glass phenolic boards, where deflection substantially ceases as soon as a stabilizing or support portion engages or comes into contact with the upper surface 12a.

Figure 7:
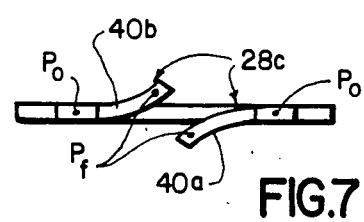
FIG. 7 is a view similar to FIG. 5 , but showing and embodiment wherein the stabilizing or support portions are created by forming.

The specific manner in which the stabilizing or support portions are formed within the space between the legs 22 is not critical. FIGS. 5–7 show different methods used to obtain a stabilizing edge in accordance with the present invention. FIG. 5 illustrates the stabilizing or support portions 36a, 36b formed by lancing the flat portion 18. FIG. 6 shows the stabilizing portions 38a and 38b formed by drawing, and FIG. 7 illustrates the stabilizing portions 40a and 40b formed by pressure forming. With regard to all FIGS. 5–7, it will be noted that the conventional pressure points $P_o$ are located at the central or cutting plane of the legs 22 where minimal resistance to deformation of the main body portion 16 is provided. In each embodiment there is also shown the position of the final pressure or pivot points $P_f$ which are spaced from a respective major surface 18a, 18b of the main body portion 16 so as to increase the resistive moment or torque tending to prevent bending or deflection of the legs 22 in the region of the upper surface 12a.

Advantageously, the pivot or pressure points $P_f$ are spaced from the main body portion 16 a distance $D_f$ (FIG. 4) selected from the range of 1 to 2.5 times the material thickness of the flat body portion 18. In accordance with one presently preferred embodiment, the aforementioned distance $D_f$ is approximately equal to the material thickness of the flat body portion.

Thus, in the design in accordance with the present invention there is provided an additional "support" on each side of and spaced from the main body portion. The supports abut against the upper surface of the pre-drilled circuit board, or are spaced close to same, creating "remote" or "offset" pivot points $P_f$ which provide additional stability to the tab. When a side force F is applied to the tab 34, the entire cross-section of each of the legs is in tension including the cross-section which is normally uner compression with the standard tab 10. The load on the tab 34 is smaller than the load generated by the same force on a conventional tab because the bending moment shifts from the center plane of the part to the pivoting or pressure points $P_f$ as described. Therefore, less tension is generated on the legs 22 due to the longer moment arm from the legs to the pivot points $P_f$. The "supports" of the tab 34 makes contact with the pre-drilled circuit board 12 at the pressure points $P_f$. The design is most effective when the pressure or pivot points $P_f$ are as far from the center or cutting plane as possible, and when the "supports" are formed into the curved shape of a section of a dome (e.g. FIG. 6) because every element of a dome section is under compressive load and a dome-shaped support portion itself will not normally fail.

The design in accordnce with the invention overcomes the disadvantages of the prior art tab constructions. Tests on the part shows that the resistance to side forces F increases by a factor of more than two compared with standard or conventional tabs. Additionally, the tabs having the described construction use no more material than the present standard two leg, pre-drilled circuit board tabs and use minimal printed circuit space. The construction also maintains the configuration, size and location of the present standard mounting legs. Additionally, since the support or stabilizing portions are between the legs 22, the stabilizing elements do not interfere with the carrier strip (resulting in ears 26), so that the part may be made in strip or continuous form and used in conjunction with presently available insertion machines with no modifications.

While the invention is described with reference to specific embodiments thereof and with respect to the incorporation therein of certain combinations of features, it is to be understood that the invention may be embodied in other forms, many of which do not incorporate all of the features present in this specific embodiment of this invention which has been described. For this reason, the invention is to be taken and limited only as defined by the claims that follow.

What is claimed is:

1. A quick disconnect contact for mounting on a pre-drilled quick circuit board provided with two spaced holes for each contact, the contact comprising a generally flat portion defining oppositely facing major surfaces and two generally parallel mounting legs which are co-planar with said flat portion and which are spaced from each other and dimensioned to be receivable within the spaced holes, said flat portion having a stabilizing edge between said mounting legs proximate to the printed circuit board when said mounting legs are fully inserted into the holes and the contact is secured to the printed circuit board, said stabilizing edge forming two stabilizing portions between said mounting legs, each stabilizing portion defining a pivot or pressure point spaced from or offset from an associated one of said major surfaces, whereby said stabilizing portions shift the pivot or pressure points from a plane coplanar with said flat portion to said stabilizing portions spaced from said flat portion thereby minimizing deformation and likelihood of breakage of said mounting legs upon application of external forces on the major surfaces of the contact.

2. A contact as defined in claim 1, wherein said flat portion is rectangular to form a male quick disconnect tab.

3. A contact as defined in claim 1, wherein said stabilizing edge is a continuous edge between said mounting legs which extends from one mounting leg to a point spaced from one of said major surfaces to form one said pivot or pressure point and form the other mounting leg to a point spaced from the other major surface to form another said pivot or pressure point and which crosses said plane at a point substantially between said mounting legs.

4. A contact as defined in claim 1, wherein said stabilizing edge is a discontinuous edge interrupted substantially midway between said mounting legs to form cooperating substantially parallel stabilizing portions on opposing sides of said flat portion, each of which define an acute angle with respect to said first plane.

5. A contact as defined in claim 1, wherein said stabilizing edge is a discontinuous edge interrupted substantially midway between said mounting legs to form cooperating substantially parallel stabilizing portions on opposing sides of said flat portion and which are substantially parallel to said first plane.

6. A contact as defined in claim 1, wherein said pivot or pressure points are spaced from said first plane a distance selected from the range of 1 to 2.5 times the material thickness of said flat portion.

7. A contact as defined in claim 6, wherein said distance is approximately equal to the material thickness of said flat portion.

8. A contact as defined in claim 1, wherein said stabilizing edge is substantially in abutment against the upper surface of a printed circuit board when the contact is mounted thereon.

9. A contact as defined in claim 1, wherein said stabilizing edge is spaced from the upper surface of a printed circuit board when the contact is mounted thereon, said spacing being selected to limit bending of the contact a maximum of approximately 15° from the mounted vertical position.

10. A method of making a quick disconnect contact for mounting on a pre-drilled circuit board provided with two spaced holes for each contact, wherein the contact comprises a generally flat portion defining a first plane and oppositely facing major surfaces and two generally parallel mounting legs which are coplanar with said flat portion and which are spaced from each other and dimensioned to be receivable within the spaced holes, said flat portion exhibiting a stabilizing edge between said mounting legs which defines a second plane substantially orthogonal to said first plane and arranged with respect to said mounting legs to dispose said stabilizing edge in substantial abutment to the printed circuit board when said mounting legs are fully inserted into the holes and the contact is mounted on the printed circuit board, said stabilizing edge forming two stabilizing portions defining pivot or pressure points spaced from said first plane and each offset from an associated major surface, whereby said stabilizing edge shifts the pivot or pressure point from said first plane to said stabilizing portions and minimizes deformation and likelihood of breakage of said mounting legs upon application of external forces on the major surfaces of said contact, said stabilizing portions being created by deforming said flat portion.

11. A method as defined in claim 10, wherein said step of deforming comprises lancing said flat portion.

12. A method as defined in claim 10, wherein said step of deforming comprising forming said flat portion.

13. A method as defined in claim 10, wherein said step of deforming comprises drawing said flat portion.

* * * * *